United States Patent [19]
Autry et al.

[11] Patent Number: 5,821,617
[45] Date of Patent: Oct. 13, 1998

[54] SURFACE MOUNT PACKAGE WITH LOW COEFFICIENT OF THERMAL EXPANSION

[75] Inventors: Tracy Autry, Mission Viejo; Fernando Lynch, Anaheim; Dan Tulbure, Irvine, all of Calif.

[73] Assignee: Microsemi Corporation, Santa Ana, Calif.

[21] Appl. No.: 687,944

[22] Filed: Jul. 29, 1996

[51] Int. Cl.[6] .................................................. H01L 23/053
[52] U.S. Cl. ........................... 257/701; 257/703; 257/705
[58] Field of Search ..................................... 257/703, 704, 257/705, 778, 701, 723, 746

[56] References Cited

U.S. PATENT DOCUMENTS 4,680,618  7/1987  Kuroda et al. ........................... 257/746
4,827,082  5/1989  Horiuchi et al. ........................ 257/703

*Primary Examiner*—Tom Thomas
*Assistant Examiner*—Roy Potter
*Attorney, Agent, or Firm*—Michael A. Sileo, Jr.; Gary C. Honeycutt

[57] ABSTRACT

A surface mount package for use with large area silicon device. The package uses a pressed ceramic frame and solid metal pads which are closely matched for coefficient of thermal expansion (CTE) to each other and to the silicon die. The package is specifically designed for large area die (greater than 0.0625 inches squared) and for high temperature eutectic alloy bonding. All materials of the package are CTE matched to each other and to silicon within 10%.

13 Claims, 2 Drawing Sheets

SURFACE MOUNT PACKAGE WITH LOW COEFFICIENT OF THERMAL EXPANSION

BACKGROUND OF THE INVENTION

1. Field of Invention

This invention relates generally to a semiconductor device including a large silicon die having an area greater than 0.0625 inches$^2$. More particularly, the invention relates to such a device including a surface mount package comprising a metal base and ceramic frame having substantially the same coefficient of thermal expansion (CTE), closely matched to the CTE of the silicon die.

2. Description of Related Art

Semiconductor circuit component manufacturers are rapidly increasing the size and power-handling capacity of silicon devices. MOSFET and IGBT die are available up to size 9 (up to 0.250 inches$^2$); however, there is no suitable power package for such large silicon die, because existing packages are not made up entirely of parts that have the same, or substantially the same CTE. Some degree of CTE-matching of package parts has been implemented; however, it has not been recognized that the larger silicon die require a dramatically closer CTE match. Additionally, it is desirable to parallel or integrate devices onto one CTE-matched substrate for use as a power module.

A surface mount package is ideal for housing these large area die and for soldering to a power module substrate. As the die and package sizes increase, the need for a closer CTE match becomes more critical. If the CTE is not closely matched, the package or solder joint will be stressed during operational thermal cycling and may crack or fail. There have been tremendous advances in metal/ceramic composites and graphite materials for heat sinks. These materials exhibit enhanced thermal conductivity with low CTE. These new materials are suited for use with high thermal conductivity, low CTE substrates. It is therefore highly desirable to develop surface mount packages having low CTE to match these new materials.

Most ceramic surface mount packages utilize alumina ($Al_2O_3$) as the wall or base. Alumina is selected because its CTE (7ppm/°C.) is close to that of silicon (4.2ppm/°C.). Most manufacturers use pre-fired alumina (green tape) which can be stamped or otherwise shaped into a desired package. After firing, a dense chemically resistant substrate is formed. However, alumina is a poor conductor of heat, having a thermal conductivity ($T_c$) of 24 W/m-K. By comparison, copper has a $T_c$ 390 W/m-K.

Horiuchi et al U.S. Pat. No. 4,827,082 discloses the use of a ceramic base having a higher $T_c$ material than alumina. AlN ($T_c$=170 W/m-K) or SiC ($T_c$=140 W/m-K) is used instead of alumina. Use of the invention is severely limited, due to the high cost of AlN and SiC.

Gernitis et al. U.S. Pat. No. 4,025,997 shows a composite metal heat sink having a matched CTE, soldered to an alumina substrate opposite the silicon die. Disclosed metal composites include molybdenum clad copper and copper clad molybdenum. The disadvantage of this approach is that the alumina layer limits the conduction of heat to the metal base.

Shinko Electric released a publication entitled "Power Transistor Ceramic Package, LCC-3 Series" which utilizes an alumina base between tungsten/copper plates. Pure tungsten vias interconnect the two plates. $T_c$ is limited by the tungsten (170 W/m-K) and the cross-sectional area of the vias (about 25% of the area).

Medeiros III et al. U.S. Pat. No. 5,111,277, discloses a surface mount package having high thermal conductivity. The invention utilizes ceramic (typically $Al_2O_3$) with CTE=7ppm/°C. for the frame of the package. Solid composite metal pads are brazed to the ceramic frame. Copper/tungsten (Cu/W) pads are chosen for their close CTE match (7ppm/°C.) to the $Al_2O_3$. This design also employs a Kovar seal ring (CTE=5.9) brazed to the ceramic frame to allow seam welding. The advantage to this approach is exceptional thermal and electrical conductivity and CTE match of pad to frame for braze integrity. The disadvantages of the design are mismatch to silicon (CTE=4.2ppm/°C.), high complexity of piece parts, and high cost.

The mismatch of the solid Cu/W pad is acceptable when using low temperature solders for bonding silicon die. However, for eutectic alloy high temperature silicon die attach (such as Au/Si or Au/Ge) or for very large area die, the mismatch may lead to long term failure, due to thermal cycling during operation. The approach also employs pads with a pedestal shape and a separate Kovar seal ring (not CTE matched to frame), which complicates tooling and adversely affects high volume production. Cu/W is relatively popular at the time of this patent; however, as with most composites, the cost is high. These factors contribute to make this design equally expensive compared to the Shinko design.

Prior to the present invention, no one has recognized the dramatically increased level of thermal cycling stress created in such a ceramic package, due to the greater size of currently available silicon devices.

SUMMARY OF THE INVENTION

One object of the invention is to provide a hermetically sealed ceramic package that includes a solid pad design, while enhancing reliability and performance by matching the CTE of package parts to the silicon die. It is critical, for many applications, to use materials that are matched to each other and to silicon within 10%. Another object is to reduce the cost of the package by using simple materials (non-alloys) which are readily available, and to reduce the complexity of the design to allow for high volume manufacturing.

BRIEF DESCRIPTION OF THE DRAWINGS

The above-stated objects and advantages are achieved in accordance with the specifications and drawings which follow.

DETAILED DESCRIPTION

Figure 1:
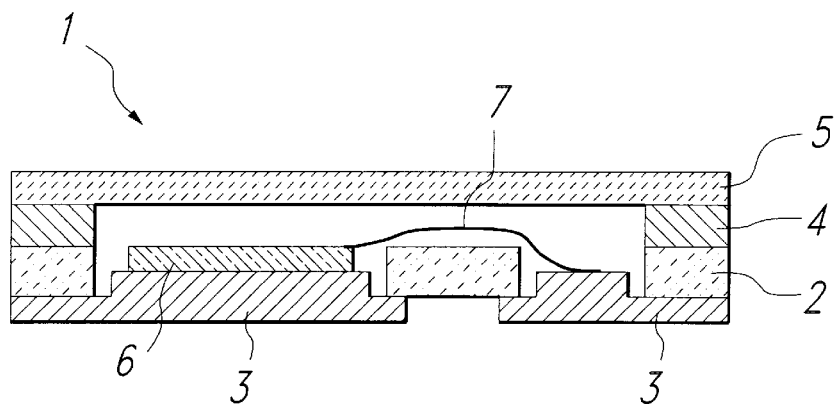
FIG. 1 is a cross-section view of a ceramic surface mount package known in the prior art.

As shown in FIG. 1, surface mount package 1 is an example of known prior art. The package has a ceramic ($Al_2O_3$) frame 2. The apertures in the ceramic are sealed by copper/tungsten (Cu/W) pads 3.

The Cu/W pads have a pedestal shape, and are brazed to the ceramic frame. A Kovar weld ring 4 is brazed to the other side of the frame. Silicon die 6 is soldered to one Cu/W pad, and then is bonded by wires 7 to the other pad. This design provides proper thermal and electrical transfer, but has the disadvantage of a complex design, and the parts are not CTE matched to silicon.

Figure 2:
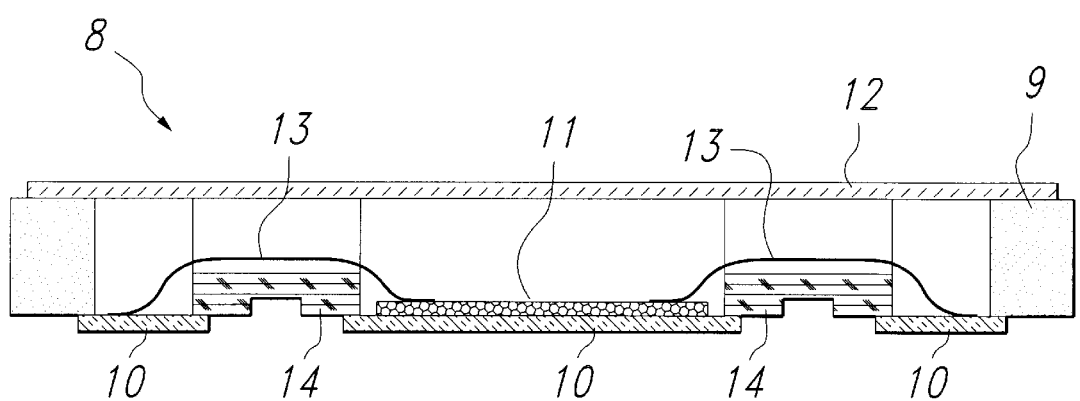
FIG. 2 is a cross-sectional view of a surface mount package and device comprising a pressed mullite frame molybdenum pads, and an Alloy 42 lid. The drawing shows a large area silicon die with bond wires in place.

As shown in FIG. 2, the device of the invention includes surface mount package 8, containing a silicon power MOSFET 11 having source, drain, and gate terminals connected to pads 10, respectively . The package is superior to the existing art, particularly for applications requiring large silicon die (>0.0625 inches$^2$) and eutectic alloy die bonding. The package differs from prior designs, in that it eliminates the seal ring, the pedestal shape of the pads, and the use of composite pad materials.

Ceramic frame 9 is a single-piece structure, made of mullite ($3Al_2O_3$ $2SiO_2$). The ceramic may include fillers to influence its properties. For example, a pigment may be added to impart to the ceramic a desired coloration. Mullite is a critical material, due to its CTE match with silicon (4.5ppm/°C.), and it has a lower cost than $Al_2O_3$. The use of a single-piece frame increases the strength, reliability, and hermeticity of the package.

In the preferred embodiment, pads 10 consist essentially of flat molybdenum plates, shaped to provide uniform thickness throughout, such that each major surface consists of a single plane. Molybdenum is preferred due to its very close CTE match to mullite and silicon (4.9ppm/°C.). Composite metals are rejected due to high cost and higher CTE. Molybdenum is relatively light and has adequate thermal ($T_c$=140 W/m-K) and electrical conductivity, especially when the thickness is limited to less than 0.025".

Molybdenum pads 10 are brazed to one side of mullite frame 9. The pads can be accessed from the other side to accept a large area silicon die 11. The other pads are used for wire bonding 13.

Surface mount package 8 is sealed by soldering an Alloy 42 (or equivalent) lid 12 to the ceramic frame 9. Alloy 42 is chosen due to its very low cost, ease of machining or stamping, and close CTE match to the other elements (4.3ppm/°C.). Soldering is preferred over seam welding because it is a lower cost process and less likely to transfer stress to the package. Large area silicon die must be sealed in a controlled atmosphere to prevent moisture from contaminating the junction. Solder seal can be performed in a DAP sealer or belt furnace for high volume, low cost manufacturing, while maintaining a controlled atmosphere.

The coefficient of thermal expansion (CTE) of all components of the package are matched within 10% of 4.5ppm/°C., therefore high temperature eutectic die attach material can be used. Eutectic materials such as Au/Si or Au/Ge are preferred for attaching large area silicon die, to improve long term reliability and performance. The eutectic bonding is typically performed at 400° C.

Bond wires 13 electrically interconnect the silicon die 11 with the pads 10. The bond wire 13 is typically manufactured from aluminum and has a diameter of about 0.020". The bond wire 13 may sag as a result of handling or acceleration. Tunnels 14 of the mullite frame 9 form the highest portion of the base geometry inside package 8. Therefore, if bond wires 13 sag or move, the wires will contact the central portion 14 rather than a metallic component. Therefore, wire sag or wire movement will not result in an electrical short circuit.

Subsequent to die attach and wire bonding, package 8 is sealed with lid 12. The lid is Alloy 42, or another metal having a coefficient of thermal expansion equal to that of the ceramic frame 9 (4.5ppm/°C.). The lid is solder sealed using Au/Sn (or equivalent) solder which can be tack welded to the lid for convenience and alignment. The solder seal is typically at 300° C. which will not reflow the eutectic die attach.

Figure 3A:
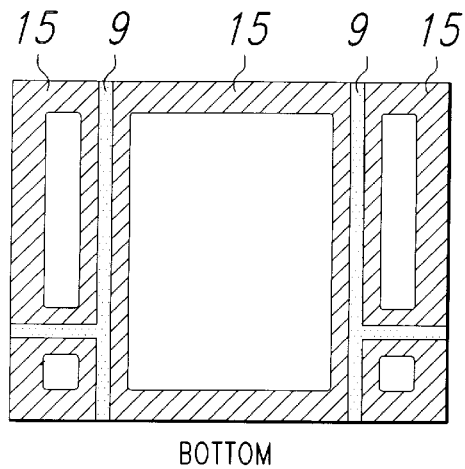
FIGS. 3A and 3B are a bottom planar view, and a top planar view, respectively, of a package comprising a mullite frame and molybdenum metallization used in the surface mount package of the invention.
Figure 3B:
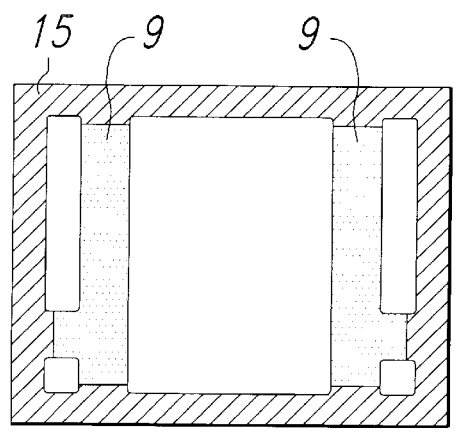

FIGS. 3A and 3B show the mullite frame of the invention. FIG. 3A shows the mullite frame after metallization in bottom planar view, while FIG. 3B shows the same frame in top planar view. The mullite is either pressed or molded by tooling, then fired at about 1400° C.–1500° C. The ceramic frame 9 is selectively metallized with moly manganese (or equivalent). The metallization is applied on the backside of the ceramic frame as illustrated in FIG. 3A. Either simultaneously or as a sequential operation, metallization is applied to the front side of the ceramic frame 9 as illustrated in FIG. 3B for lid attach. The metallization is generally applied by a screen printing operation which provides an accurate deposition of a controlled thickness.

The ceramic frame 9 is then fired at of about 1300° C.–1400° C. to bind the metallization to the ceramic frame.

The metallization is nickel plated to a thickness of from about 50 to 150 microinches. To improve adhesion of the nickel to the metallization, the ceramic may be sintered by heating to a temperature of about 600° C. in a reducing atmosphere.

The pads are pure molybdenum (or equivalent CTE material). The pads are pre-plated with nickel about 50 to 150 microinches. The pads are then ready for brazing to the ceramic frame.

Brazing with the copper/silver eutectic referred to as BT (nominal composition 72% silver 28% copper) is preferred. The braze, either as a paste or preform is deposited between the metallized surfaces 15 of the ceramic frame 9 and the pads. Alignment of the pads is maintained using a fixture such as a graphite boat. The assembly is brazed by heating to a temperature of about 800° C. in hydrogen or forming gas (hydrogen/nitrogen mixture).

Figure 4A:
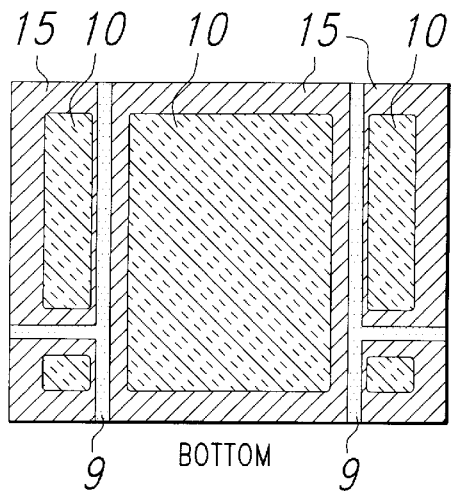
FIGS. 4A and 4B shown in bottom planar view and top planar view, respectively, the surface mount package of the invention subsequent to brazing the molybdenum pads to the bottom side of the frame.
Figure 4B:
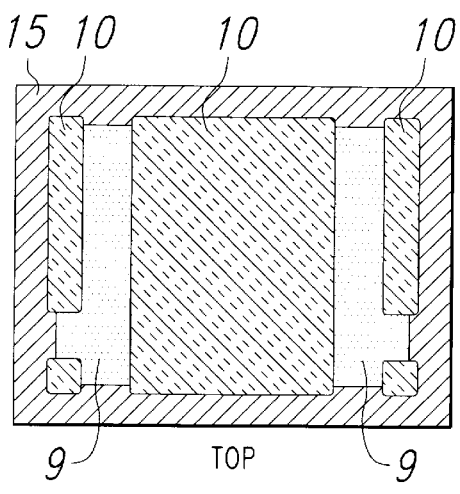

The brazed assembly is illustrated in bottom planar view in FIG. 4A and top planar view in FIG. 4B. The pads are accessible from view 4B for receiving the silicon die and wire bonds. To facilitate die attach and bonding, the assembly 8 may be gold plated with about 30 to 60 microinches. After gold plating, the chip is eutectically attached and wire bonded. The lid is then solder sealed to the ceramic frame.

It is apparent that there has been provided in accordance with this invention an improved surface mount package, fully satisfying the objects, means and advantages set forth above. While the invention has been described in combination with specific embodiments and examples thereof, many alternatives, modifications and variations will be apparent to those skilled in the art, after reading the foregoing description. For example, although a five-terminal silicon device is illustrated in detail, the invention also includes two-terminal, three-terminal, and four-terminal devices, as well as devices having more than five terminals. Accordingly, it is intended to embrace all such alternatives, modifications and variations within the spirit and scope of the appended claims.

We claim:

1. A ceramic package for a large area silicon die, comprising a ceramic frame having a plurality of openings in the bottom thereof; a plurality of metal plates secured to the bottom of said frame, such that each opening in the bottom of the frame is sealed by a metal plate, said frame and said plates having essentially the same coefficient of thermal expansion; and means between at least two of said plates for supporting a connection wire.

2. The package of claim 1 wherein said ceramic frame is formed as a single piece of mullite, said plates have a coefficient of thermal expansion within 10% of mullite, the area of the silicon die is at least 0.0625 square inches, and the die is bonded to one of the pads by means of a high-temperature alloy.

3. The package of claim 1 wherein said plates consist essentially of molybdenum, having a coefficient of thermal expansion=4.5 ppm/°C.+/−10%.

4. The package of claim 1 including an Alloy 42 lid soldered to the ceramic frame.

5. The package of claim 1 wherein said ceramic frame is mullite and said plates are molybdenum.

6. A package as in claim 1, wherein the entire package consists essentially of parts having a CTE within 10% of the coefficient of thermal expansion for silicon.

7. A package as in claim 1 wherein said openings are coplanar, and said plates have a uniform thickness, whereby the package is adapted for surface mounting.

8. A package as in claim 1 wherein said frame includes an elevated tunnel structure between two of said metal plates, for supporting a connection wire.

9. A packaged semiconductor device comprising a ceramic frame having a plurality of openings in the bottom thereof, a plurality of metal plates secured to the bottom of said frame, such that each opening in the bottom of the frame is sealed by a metal plate, and a large area silicon chip mounted on one of said plates; at least one terminal of said chip having an electrical connection to one of said plates other than the plate on which the chip is mounted, said frame and said plates having essentially the same coefficient of thermal expansion as silicon.

10. A device as in claim 9, wherein said chip has an area greater than 0.0625 square inches.

11. A device as in claim 9, wherein the entire device consists essentially of parts have a coefficient of thermal expansion within 10% of the coefficient of thermal expansion for silicon.

12. A device as in claim 9 wherein said openings are coplanar, and said plates have a uniform thickness, whereby the device is adapted for surface mounting.

13. A device as in claim 9 wherein said frame includes an elevated tunnel structure between two of said metal plates, for supporting a connection wire.

* * * * *